United States Patent
Genda et al.

(10) Patent No.: US 7,459,378 B2
(45) Date of Patent: Dec. 2, 2008

(54) WAFER DIVIDING METHOD

(75) Inventors: Satoshi Genda, Tokyo (JP); Hiroshi Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/269,548

(22) Filed: Nov. 9, 2005

(65) Prior Publication Data
US 2006/0105546 A1 May 18, 2006

(30) Foreign Application Priority Data
Nov. 12, 2004 (JP) .............................. 2004-329227

(51) Int. Cl.
*H01L 21/00* (2006.01)
(52) U.S. Cl. ................ 438/463; 257/E21.598
(58) Field of Classification Search .................. 438/33, 438/68, 110, 464, 463
See application file for complete search history.

(56) References Cited

U.S. PATENT DOCUMENTS

| | | | |
|---|---|---|---|
| 4,355,457 A * | 10/1982 | Barlett et al. ............... | 438/460 |
| 6,420,206 B1 * | 7/2002 | Le et al. ...................... | 438/68 |
| 6,498,075 B1 | 12/2002 | Fujimoto et al. | |
| 6,730,579 B1 * | 5/2004 | Sasaka ........................ | 438/464 |
| 6,734,083 B2 * | 5/2004 | Kobayashi .................. | 438/462 |
| 7,129,114 B2 * | 10/2006 | Akram ....................... | 438/110 |
| 2006/0079024 A1 * | 4/2006 | Akram ....................... | 438/110 |

FOREIGN PATENT DOCUMENTS

| JP | 361095544 A | * | 5/1986 |
|---|---|---|---|
| JP | 2001-85365 | | 3/2001 |

* cited by examiner

Primary Examiner—David A Zarneke
(74) Attorney, Agent, or Firm—Smith, Gambrell & Russell, LLP

(57) ABSTRACT

A method of dividing a wafer having a plurality of micro electro mechanical systems and a plurality of streets for partitioning the micro electro mechanical systems formed on the front surface of a wafer substrate, the method comprising a protective tape affixing step for affixing a protective tape to the front surface of the wafer; a cut groove-forming step for forming a cut groove by cutting the wafer having the protective tape affixed thereto along the streets from the back surface of the wafer substrate, leaving a cutting margin having a predetermined thickness on the front surface side of the wafer substrate; and a cutting step for cutting the cutting margins by applying a laser beam to the cutting margins of the cut grooves formed along the streets.

3 Claims, 7 Drawing Sheets

(a)

(b)

(a)

(b)

WAFER DIVIDING METHOD

FIELD OF THE INVENTION

The present invention relates to a method of dividing a wafer having a plurality of micro electromechanical Systems (MEMS) formed on the front surface of a wafer substrate, along streets for partitioning the micro electro mechanical systems.

DESCRIPTION OF THE PRIOR ART

A wafer having a plurality of micro electro mechanical systems on the front surface of a wafer substrate made of silicon, etc. is divided along streets for partitioning the micro electro mechanical systems into individual micro electro mechanical system devices, which are widely used in medical and optical instruments. A cutting machine called "dicer" is generally used to divide this type of wafer along the streets. This cutting machine comprises a chuck table for holding a workpiece, a cutting means having a cutting blade for cutting the workpiece held on the chuck table, and a processing-feed means for moving the chuck table and the cutting means relative to each other, as disclosed by JP-A 2001-85365. The wafer is cut along the street by processing-feeding the chuck table holding the workpiece while rotating the cutting blade.

Since the micro electro mechanical systems have a fine precision structure, when the wafer is cut along the streets by the cutting machine, there is a problem that cutting water supplied during cutting enters the fine micro electro mechanical systems to greatly reduce their quality.

To solve the above problem, a method of cutting a wafer having a plurality of micro electro mechanical systems (MEMS) formed on the front surface of a wafer substrate from the back side by affixing a protective tape to the front surface of the wafer and placing the wafer on the chuck table of the cutting machine such that the protective tape side faces down is attempted.

Even in the above cutting method, however, the cutting water enters the gap between the cut wafer and the protective tape, thereby making it impossible to eliminate deterioration in the quality of the micro electro mechanical systems.

SUMMARY OF THE INVENTION

It is an object of the present invention to provide a wafer dividing method capable of dividing a wafer along predetermined streets without deteriorating the quality of the micro electro mechanical systems.

To attain the above object, according to the present invention, there is provided a method of dividing a wafer having a plurality of micro electro mechanical systems and a plurality of streets for partitioning the micro electro mechanical systems formed on the front surface of a wafer substrate, wherein the method comprises:

a protective tape affixing step for affixing a protective tape to the front surface of the wafer;

a cut groove-forming step for forming a cut groove by cutting the wafer having the protective tape affixed thereto along the streets, from the back surface of the wafer substrate, leaving a cutting margin having a predetermined thickness on the front surface side of the wafer substrate; and a cutting step for cutting the cutting margins by applying a laser beam to the cutting margins of the cut grooves formed along the streets.

Preferably, the thickness of the above cutting margin is set to 5 to 20 μm.

In the present invention, since the protective tape is affixed to the front surface of the wafer and the step of forming a cut groove along the streets is carried out from the back surface of the wafer substrate of the wafer onto which the protective tape is affixed, cutting water does not enter the micro electro mechanical systems in the cut groove-forming step. Accordingly, as in the cut groove-forming step, the cut grooves are formed in the wafer substrate of the wafer, leaving a cutting margin having a predetermined thickness on the front surface side, cutting water does not enter the gap between the protective tape and the wafer. Therefore, the deterioration in the quality of the micro electro mechanical systems by entry of cutting water can be prevented in advance. Further, since the cutting step is carried out by laser processing without using processing-water, the processing-water does not enter the micro electro mechanical systems.

DETAILED DESCRIPTION OF THE PREFERRED EMBODIMENT

A preferred embodiment of the wafer dividing method of the present invention will be described in detail hereinunder with reference to the accompanying drawings.

Figure 1:
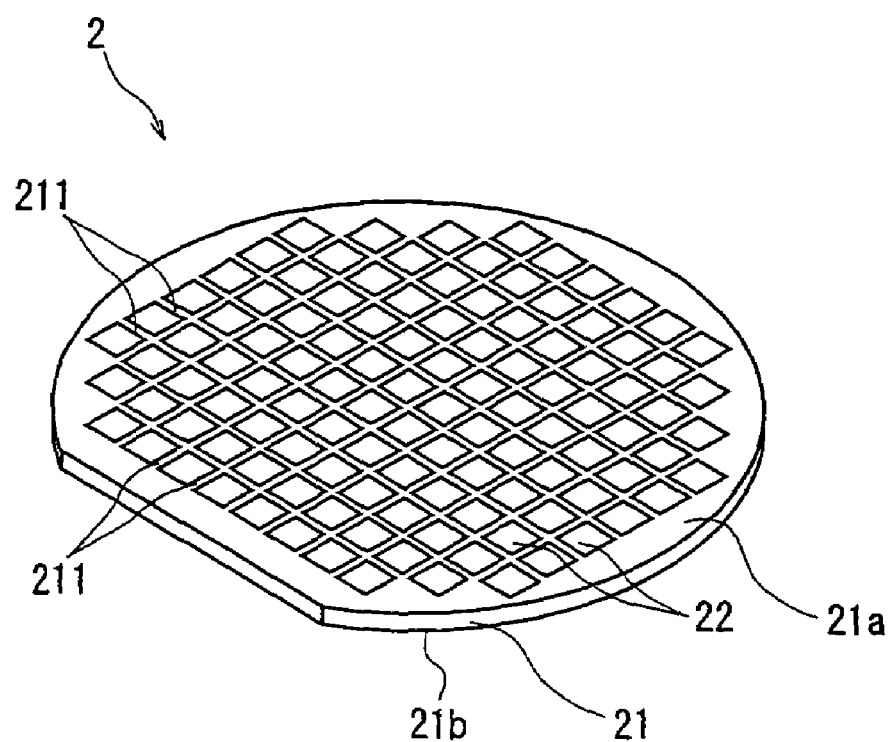
FIG. 1 is a perspective view of a wafer to be divided by the wafer dividing method of the present invention.
Figure 2:
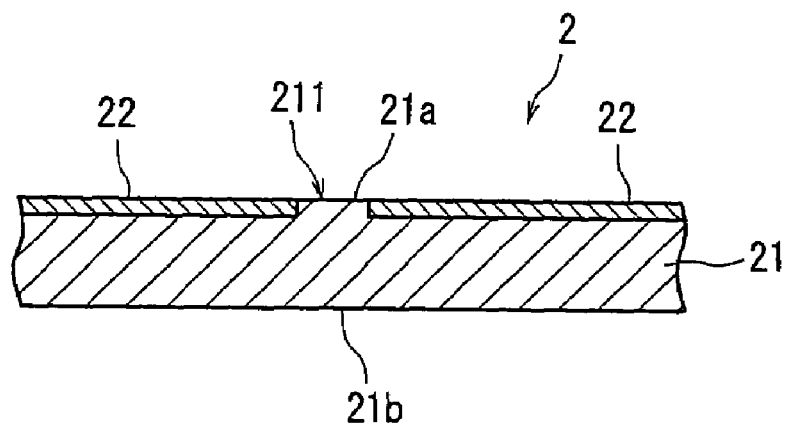
FIG. 2 is an enlarged sectional view of part of the wafer shown in FIG. 1.

FIG. 1 is a perspective view of a wafer to be divided according to the present invention, and FIG. 2 is an enlarged sectional view of the wafer shown in FIG. 1. The wafer 2 shown in FIG. 1 and FIG. 2 has a plurality of micro electro mechanical systems (MEMS) 22 and a plurality of streets 211 for partitioning the micro electro mechanical systems each arranged in a lattice pattern on the front surface 21*a* of a wafer substrate 21 that is made of silicon and has a thickness of 600 μm, for example.

Figure 3:
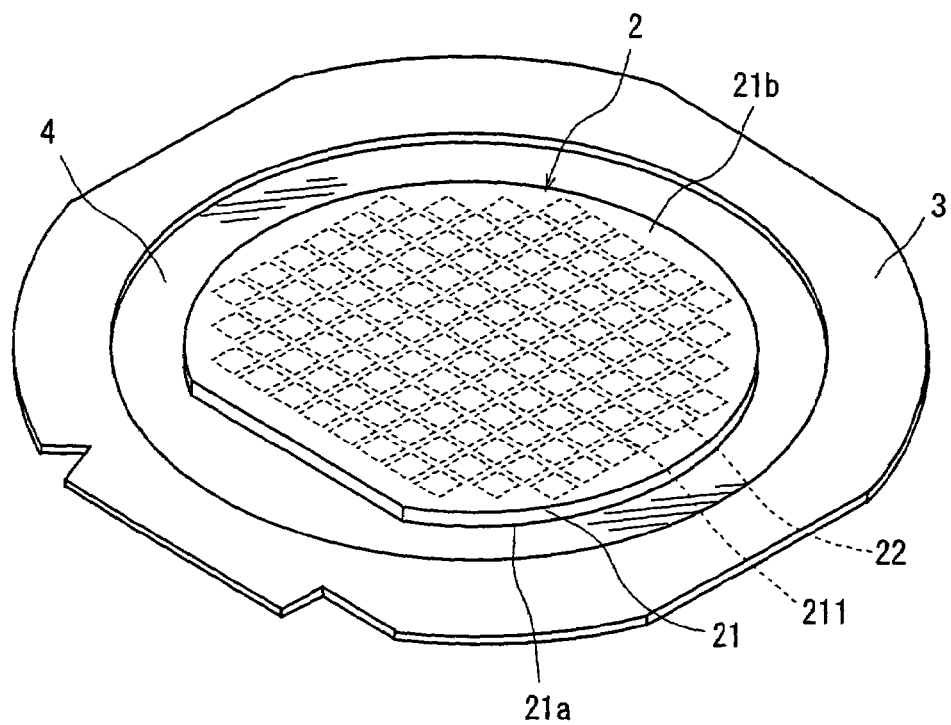
FIG. 3 is a perspective view showing a state where the wafer has been put on the surface of a protective tape mounted on an annular frame by carrying out the protective tape affixing step in the wafer dividing method of the present invention.

To divide the above wafer 2 along the streets 211, the step of affixing a protective tape to the front surface (front surface 21a side of the wafer substrate 21) of the wafer 2 is carried out. That is, as shown in FIG. 3, the front surface 21a side of the wafer substrate 21 is put on the surface of the protective tape 4, which is composed of a polyolefin sheet and is so mounted on an annular frame 3 as to cover its inner opening. Therefore, the back surface 21b of the wafer substrate 21 faces up.

Figure 4:
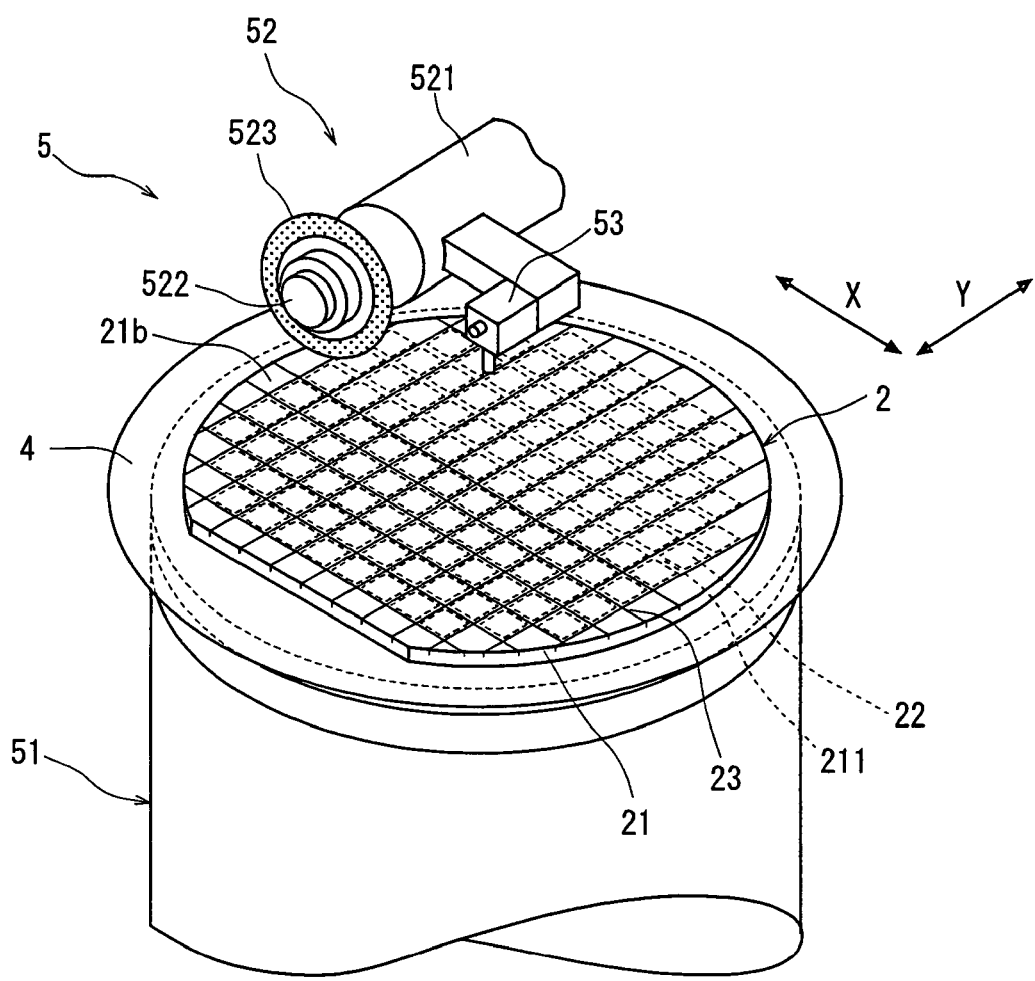
FIG. 4 is a perspective view of the principal section of a cutting machine for carrying out the cut groove-forming step in the wafer dividing method of the present invention.

Next comes the step of forming a cut groove by cutting the wafer 2 put on the protective tape 4, along the streets 211, from the back surface 21b of the wafer substrate 21, leaving a cutting margin having a predetermined thickness on the front surface 21a side of the wafer substrate 21. In this cut groove-forming step, as shown in FIG. 4, a cutting machine 5, which is generally used as a dicing machine, may be used. The cutting machine 5 comprises a chuck table 51 for holding a workpiece, a cutting means 52 for cutting the workpiece held on the chuck table 51 and an image pick-up means 53 for picking up an image of the workpiece held on the chuck table 51.

The chuck table 51 is so constituted as to suction-hold the workpiece and is designed to be moved in a cutting feed direction indicated by an arrow X in FIG. 4 by a processing-feed means (not shown) and in an indexing-feed direction indicated by an arrow Y in FIG. 4 by an indexing-feed means that is not shown. The above cutting means 52 has a spindle housing 521, a rotary spindle 522 rotatably arranged in the spindle housing 521, and a cutting blade 523 fitted on to the end portion of the rotary spindle 522. The rotary spindle 522 is rotary-driven by a drive mechanism that is not shown. A whetstone blade having a width of 30 μm is used as the cutting blade 523 in the illustrated embodiment. The image pick-up means 53 is mounted on the above spindle housing 521 and is constituted by an infrared illuminating means for applying infrared radiation to the workpiece, an optical system for capturing infrared radiation applied by the infrared illuminating means and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that will be described later.

To carry out the above cut groove-forming step by using the above cutting machine 5, the protective tape 4 side of the wafer 2 is placed on the chuck table 51 and is suction-held on the chuck table 51 by activating a suction means that is not shown. Therefore, the back surface 21b of the wafer substrate 21 of the wafer 2 faces up. The annular frame 3 mounted on the protective tape 4, which is not shown in FIG. 4, is held on a suitable frame holding means arranged on the chuck table 51. After the wafer 2 is thus held on the chuck table 2, the chuck table 51 is moved in the direction indicated by the arrow X to bring the wafer 2 to a position right below the image pick-up means 53. After the chuck table 51 is positioned right below the image pick-up means 53, alignment work for detecting a processing-area to be cut of the wafer 2 is carried out by the image pick-up means 53 and the control means that is not shown. That is, the image pick-up means 53 and the control means (not shown) carry out image processing such as pattern matching, etc. to align a street 211 formed in a predetermined direction of the wafer 2 with the cutting blade 523 for cutting along the street 211, thereby performing the alignment of the area to be cut. Further, the alignment of the area to be cut is also carried out on streets 211 formed on the wafer 2 in a direction perpendicular to the predetermined direction. Although the front surface 21a, on which the street 211 is formed, of the wafer substrate 21 faces down at this point, an image of the street 211 can be taken through the back surface 21b of the wafer substrate 21 as the image pick-up means 53 comprises an infrared illuminating means, an optical system for capturing infrared radiation and an image pick-up device (infrared CCD) for outputting an electric signal corresponding to the infrared radiation, as described above.

After the street 211 formed on the wafer 2 held on the chuck table 51 is detected and the alignment of the area to be cut is carried out as described above, the chuck table 51 holding the wafer 2 is moved to the cutting start position of the area to be cut. At this point, the wafer 2 is positioned such that one end (left end in FIG. 5(a)) of the street 211 to be cut is located on the right side by a predetermined distance from a position right below the cutting blade 523. After the chuck table 51, that is, the wafer 2 is positioned at the cutting start position of the area to be cut, the cutting blade 523 is moved down from a standby position shown by a two-dotted chain line in FIG. 5(a) to a predetermined cutting position shown by a solid line in FIG. 5(a). This cutting position is set to a position where the lower end of the cutting blade 523 is located above the front surface 21a of the wafer substrate 21 of the wafer 2, by a predetermined distance (5 to 20 μm).

Figure 5:
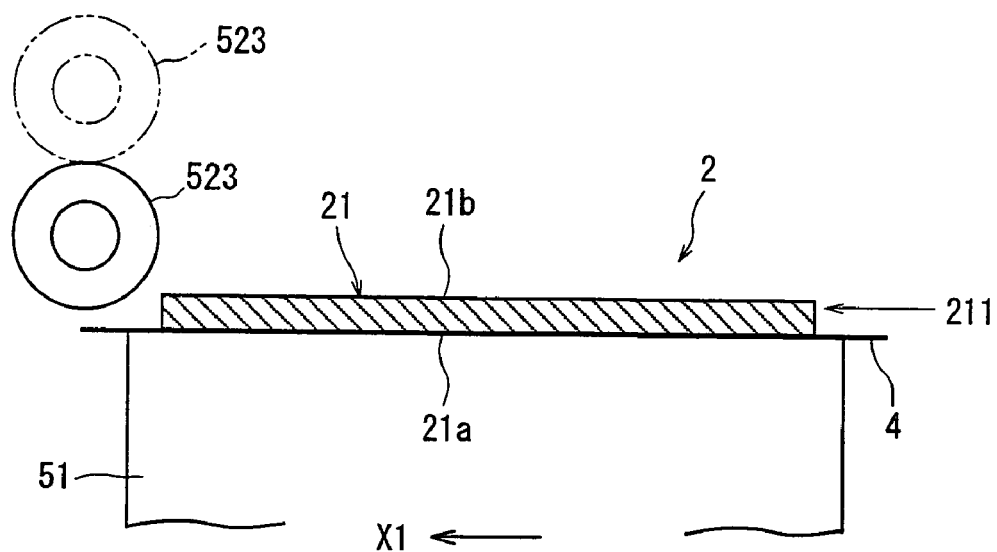
FIGS. 5(*a*) and 5(*b*) are explanatory diagrams showing the cut groove-forming step in the wafer dividing method of the present invention.
Figure 5:
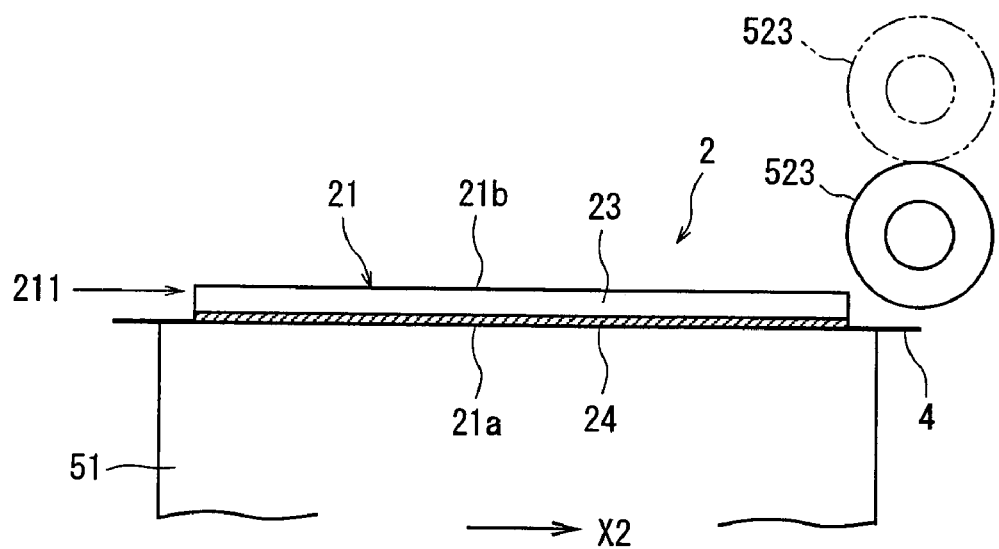
Figure 6:
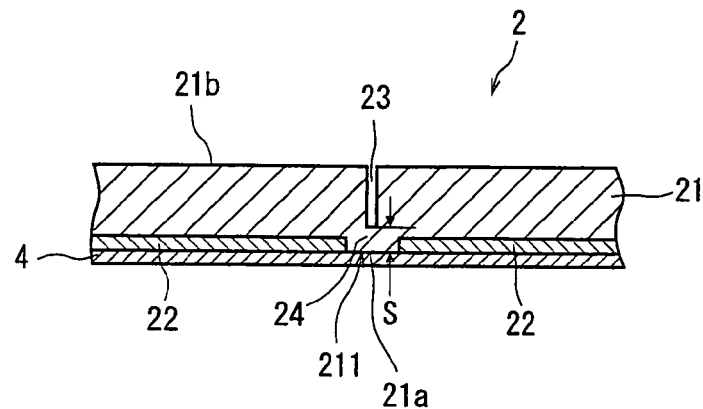
FIG. 6 is an enlarged sectional view of part of the wafer which has undergone the cut groove-forming step in the wafer dividing method of the present invention.

Then, the cutting blade 523 is allowed to rotate at a predetermined revolution, and the chuck table 51, that is, the wafer 2 is moved in the cutting-feed direction indicated by the arrow X1 in FIG. 5(a) at a predetermined cutting-feed rate. When the chuck table 51, that is, the wafer 2 reaches a position where the other end (right end in FIG. 5(b)) of the street 211 is located on the left side a predetermined distance from a position right below the cutting blade 523 as shown in FIG. 5(b), the movement of the chuck table 51, that is, the wafer 2 is stopped. By thus cutting-feeding the chuck table 51, that is, the wafer 2, a cut groove 23 is formed along the street 211 in the wafer substrate 21 of the wafer 2 as shown in FIG. 6. This cut groove 23 is formed, leaving a cutting margin 24 having a predetermined thickness on the front surface 21a side of the wafer substrate 21 of the wafer 2 as shown in FIG. 6. The thickness S of the cutting margin 24 is suitably 5 to 20 μm. When the thickness S of this cutting margin 24 is smaller than 5 μm, cracks starting from the bottom of the cut groove 23 is produced by cutting resistance in the above cut groove-forming step. When the thickness S of the cutting margin 24 is larger than 20 μm, there is a probability that the wafer 2 may not be cut by applying a laser beam in the cutting step that will be described later. Therefore, the thickness S of the cutting margin 24 is suitably 5 to 20 μm.

The above cut groove-forming step is carried out under the following processing conditions, for example.

Cutting blade: outer diameter of 52 mm, thickness of 30 μm

Revolution of cutting blade: 30,000 rpm

Cutting-feed rate: 50 mm/sec

Next, the cutting blade 523 is moved up to the standby position shown by the two-dotted chain line in FIG. 5(b), and the chuck table 51, that is, the wafer 2 is moved in the direction indicated by the arrow X2 in FIG. 5(b) to return to the position shown in FIG. 5(a). Thereafter, the chuck table 51, that is, the wafer 2 is indexing-fed by a distance corresponding to the interval between streets 211 in the direction indicated by the arrow Y in FIG. 4 to align a street 211 to be cut next with the cutting blade 523. After the street 211 to be cut next is aligned with the cutting blade 523, the above-mentioned cut groove-forming step is carried out. After the above cutting-feeding and indexing-feeding are carried out on all the streets extending in the predetermined direction, the chuck table 51 is turned at 90° to carry out the above cutting-feeding and indexing-feeding on streets extending in a direction perpendicular to the predetermined direction so as to form a cut groove 23 along all the streets 211 formed on the wafer 2.

Although the above cut groove-forming step is carried out while cutting water is supplied to a portion to be cut, as the front surface (the front surface 21a side of the wafer substrate 21) of the wafer 2 is put on the protective tape 4, cutting water does not enter the micro electro mechanical systems (MEMS) 22. Since the cut grooves 23 are formed in the wafer substrate 21 of the wafer 2 in the above cut groove-forming step, leaving the cutting margin 24 having a predetermined thickness on the front surface 21a side, cutting water does not enter the gap between the micro electro mechanical systems (MEMS) 22 and the protective tape 4 as well. Therefore, the deterioration in the quality of the micro electro mechanical systems (MEMS) 22 by entry of cutting water into the micro electro mechanical systems (MEMS) 22 can be prevented in advance.

After the above cut groove-forming step, next comes the cutting step for cutting the cutting margin 24 by applying a laser beam to the cutting margin 24 of the cut groove 23 formed along the streets 211 of the wafer 2. This cutting step is carried out by a laser beam processing machine 6 shown in FIG. 7. The laser beam processing machine 6 shown in FIG. 7 comprises a chuck table 61 for holding a workpiece, a laser beam application means 62 for applying a laser beam to the workpiece held on the chuck table 51, and an image pick-up means 63 for picking up an image of the workpiece held on the chuck table 61. The chuck table 61 is so constituted as to suction-hold the workpiece and is designed to be moved in a cutting-feed direction indicated by an arrow X in FIG. 7 by a processing-feed means and in an indexing-feed direction indicated by an arrow Y in FIG. 7 by an indexing-feed means.

Figure 8:
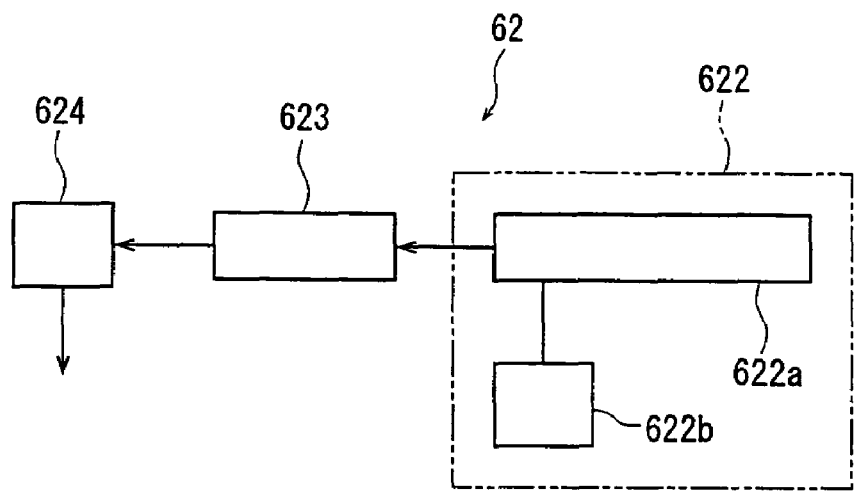
FIG. 8 is a block diagram schematically showing the constitution of a laser beam application means provided in the laser beam processing machine shown in FIG. 7.
Figure 9:
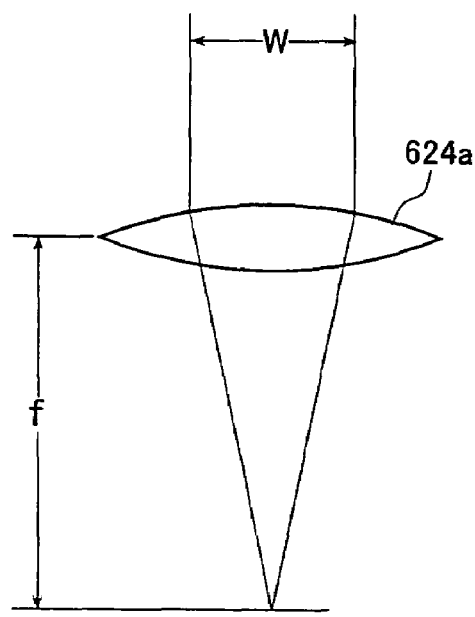
FIG. 9 is a schematic diagram for explaining the focusing spot diameter of a laser beam.

The above laser beam application means 62 has a cylindrical casing 621 arranged substantially horizontally. In the casing 621, there are installed a pulse laser beam oscillation means 622 and a transmission optical system 623, as shown in FIG. 8. The pulse laser beam oscillation means 622 is constituted by a pulse laser beam oscillator 622a composed of a YAG laser oscillator or YVO4 laser oscillator and a repetition frequency setting means 622b connected to the pulse laser beam oscillator 622a. The transmission optical system 623 comprises suitable optical elements such as a beam splitter, etc. A condenser 624 housing condenser lenses (not shown) constituted by a combination of lenses that may be formation known per se is attached to the end of the above casing 621. A laser beam oscillated from the above pulse laser beam oscillation means 622 reaches the condenser 624 through the transmission optical system 623 and is applied to the workpiece held on the above chuck table 61 from the condenser 624 at a predetermined focusing spot diameter D. This focusing spot diameter D is defined by the expression $D (\mu m) = 4 \times \lambda \times f / (\pi \times W)$ (wherein $\lambda$ is the wavelength ($\mu M$) of the pulse laser beam, W is the diameter (mm) of the pulse laser beam applied to an objective lens 624a, and f is the focusing distance (mm) of the objective lens 624a) when the pulse laser beam showing a Gaussian distribution is applied through the objective lens 624a of the condenser 624, as shown in FIG. 9.

The image pick-up means 63 attached to the end of the casing 621 constituting the above laser beam application means 62 transmits an image signal to a control means that is not shown.

Figure 7:
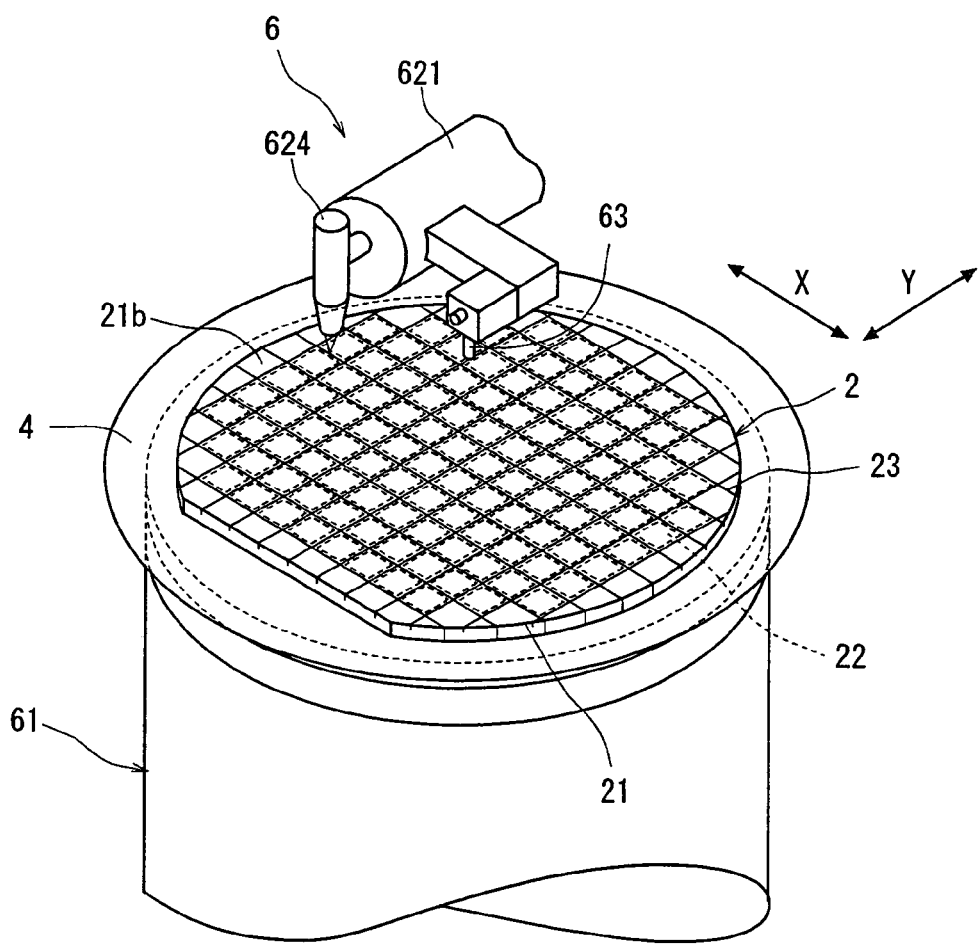
FIG. 7 is a perspective view of the principal section of a laser beam processing machine for carrying out the cutting step in the wafer dividing method of the present invention.

To carry out the above cutting step by using the above laser beam processing machine 6, the protective tape 4 side of the wafer 2, which has undergone the above cut groove-forming step, is first placed on the chuck table 61 and is suction-held on the chuck table 61 by activating a suction means that is not shown. Therefore, the back surface 21b of the wafer substrate 21 faces up. The annular frame 3 mounted on the protective tape 4, which is not shown in FIG. 7, is held on a suitable frame holding means arranged on the chuck table 61. After the wafer 2 is thus held on the chuck table 61, the chuck table 61 is moved in the direction indicated by the arrow X to bring the wafer 2 to a position right below the image pick-up means 63. Thereafter, the image pick-up means 63 and the control means (not shown) carry out image processing such as pattern matching, etc. to align the cut groove 23 formed along a street 211 of the wafer 2 with the condenser 624 of the laser beam application means 62, thereby performing the alignment of a laser beam application position.

Figure 10:
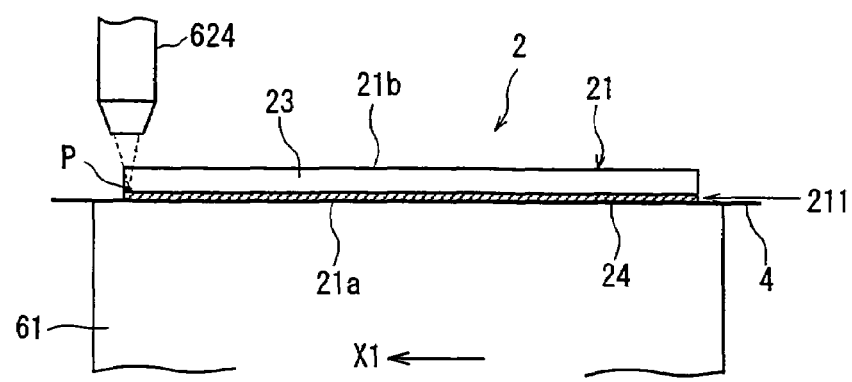
FIGS. 10(*a*) and 10(*b*) are explanatory diagrams showing the cutting step in the wafer dividing method of the present invention.
Figure 10:
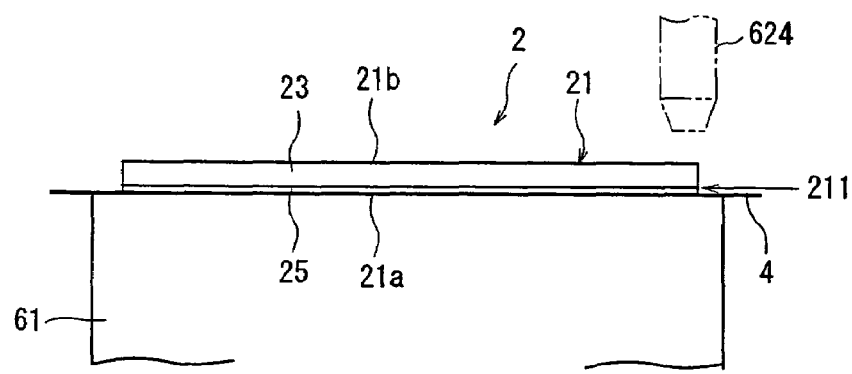
Figure 11:
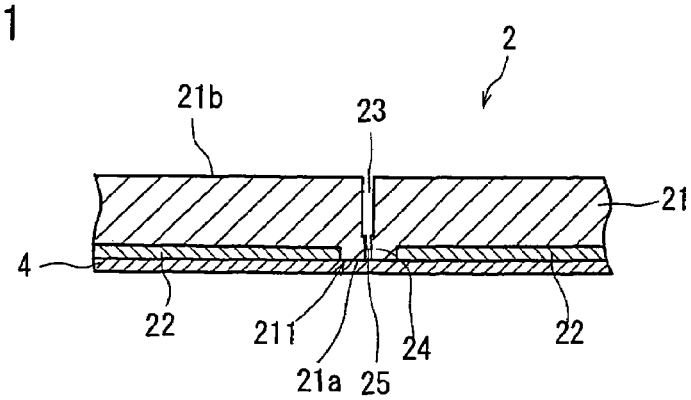
FIG. 11 is an enlarged sectional view of part of the wafer, which has undergone the cutting step in the wafer dividing method of the present invention.

After the alignment of the laser beam application position is thus carried out, the chuck table 61 is moved to a laser beam application area where the laser beam application means 62 is located, to bring one end (left end in FIG. 10(a)) of the predetermined street 211 to a position right below the condenser 624 as shown in FIG. 10(a). The chuck table 51, that is, the wafer 2 is then moved in the direction indicated by the arrow X1 in FIG. 10(a) at a predetermined processing-feed rate while a pulse laser beam of a wavelength having absorptivity for the wafer substrate made of silicon is applied from the condenser 624. When the application position of the condenser 624 of the laser beam application means 62 reaches the other end of the street 211 as shown in FIG. 10(b), the application of the pulse laser beam is suspended and the movement of the chuck table 61, that is, the wafer 2 is stopped. In this cutting step, the focusing point P of the pulse laser beam is set to a position near the top surface of the cutting margin 24 of the cut groove 23 formed in the wafer substrate 21. As a result, a groove 25 is formed in the cutting margin 24 of the cut groove 23 formed in the wafer 2 as shown in FIG. 11, whereby the wafer 2 is cut.

The processing conditions of the above cutting step are set as follows in the illustrated embodiment.

Laser: YVO4 pulse laser
Wavelength: 355 nm
Repetition frequency: 50 kHz
Average output: 1.0 to 4.0 W
Pulse width: 10 to 20 ns
Focusing spot diameter: 10 to 25 $\mu m$
Processing-feed rate: 50 to 200 mm/sec After the cutting margin 24 is cut by applying a laser beam to the cutting margin 24 of the cut groove 23 formed along the street 21 in the predetermined direction of the wafer 2 as described above, the chuck table 61 or the laser beam application means 62 is indexing-fed in the direction indicated by the arrow Y in FIG. 7 by a distance corresponding to the interval between streets 211 to carry out the above cutting step while the above laser beam is applied again. After the above processing-feeding and indexing-feeding is carried out on all the cutting margins 24 of the cut grooves 23 formed along all the streets 211 extending in the predetermined direction, the chuck table 61 is turned at 90° to carry out the above processing-feeding and indexing-feeding on the cutting margins 24 of the cut grooves 23 formed along streets 211 extending in a direction perpendicular to the above predetermined direction, whereby the wafer 2 is divided into individual micro electromechanical system devices. Since the cutting step is carried out by the laser beam processing machine and cutting water is not used as described above, cutting water does not enter the micro electro mechanical systems (MEMS) 22.

The individually divided micro electro mechanical system devices obtained by carrying out the above cutting step are carried to the pick-up step in a state where they are put on the surface of the protective tape 4 mounted on the annular frame 3.

What is claimed is:

1. A method of dividing a wafer including a substrate having on a front surface thereof a plurality of micro electro mechanical systems and a plurality of streets for partitioning the micro electro mechanical systems, said method comprising the steps of:

affixing a protective tape to the front surface of the substrate of the wafer;

cutting a groove, with cutting water and a cutting blade, in a back surface of the substrate of the wafer along each of the streets, leaving in the groove a cutting margin having a predetermined thickness on the side of the front surface of the substrate; and cutting the cutting margin to remove the same by applying a laser beam to the cutting margin without using cutting water, thereby dividing the wafer along the street and the groove.

2. The method of dividing a wafer according to claim 1, wherein the predetermined thickness of the cutting margin is set to 5 to 20 μm.

3. A method of dividing a wafer according to claim 1, wherein the cutting blade used to cut the groove is a rotary cutting blade, and the groove is cut while the cutting blade is rotating.

* * * * *